United States Patent
Li

(10) Patent No.: US 11,519,669 B2
(45) Date of Patent: Dec. 6, 2022

(54) CONDENSER AND SEMICONDUCTOR PROCESSING MACHINE

(71) Applicant: CHANGXIN MEMORY TECHNOLOGIES, INC., Hefei (CN)

(72) Inventor: Tianlong Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/442,676

(22) PCT Filed: Jun. 30, 2021

(86) PCT No.: PCT/CN2021/103674
§ 371 (c)(1),
(2) Date: Sep. 24, 2021

(87) PCT Pub. No.: WO2022/068299
PCT Pub. Date: Apr. 7, 2022

(65) Prior Publication Data
US 2022/0349654 A1     Nov. 3, 2022

(30) Foreign Application Priority Data

Sep. 30, 2020   (CN) .......................... 202011062187.X

(51) Int. Cl.
*F28B 1/02*         (2006.01)
*F28F 13/12*       (2006.01)
(Continued)

(52) U.S. Cl.
CPC ................. *F28B 1/02* (2013.01); *F28B 9/10* (2013.01); *F28B 11/00* (2013.01); *H01L 21/67017* (2013.01)

(58) Field of Classification Search
CPC .... F28B 1/02; F28B 9/10; F28B 11/00; H01L 21/67017
(Continued)

(56) References Cited

U.S. PATENT DOCUMENTS 7,138,101 B2 *   11/2006   Keller ................ B01D 53/8615
                                                                  422/170
8,650,877 B1 *    2/2014   Gustafson ............... F24S 50/20
                                                                    60/641.8
(Continued)

FOREIGN PATENT DOCUMENTS

CN          203687669 U       7/2014
CN          104253065 A      12/2014
(Continued)

OTHER PUBLICATIONS

International Search Report and English Translation cited in PCT/CN2021/103674, dated Sep. 27, 2021, 11 pages.
(Continued)

*Primary Examiner* — Joel M Attey
(74) *Attorney, Agent, or Firm* — Cooper Legal Group, LLC

(57) ABSTRACT

A condenser and semiconductor processing machine, relating to the art of semiconductor equipment. The condenser 100 includes a sealed cavity; wherein, a gas passage is provided in the sealed cavity; cooling liquid is filled around the gas passage; a gas inlet, a gas outlet, and a liquid outlet are provided on the sealed cavity, the gas inlet is communicated with the inlet of the gas passage, the gas outlet is communicated with the outlet of the gas passage, and the liquid outlet is communicated with the gas passage; the gas passage is a Tesla valve structure passage.

9 Claims, 3 Drawing Sheets

(51) Int. Cl.
*H01L 27/00* (2006.01)
*F28B 9/10* (2006.01)
*F28B 11/00* (2006.01)
*H01L 21/67* (2006.01)

(58) Field of Classification Search
USPC .......................................................... 165/113
See application file for complete search history.

(56) References Cited

U.S. PATENT DOCUMENTS

| | | | | |
|---|---|---|---|---|
| 2013/0001448 | A1* | 1/2013 | De Munck | B01D 7/02 |
| | | | | 251/129.01 |
| 2014/0374069 | A1* | 12/2014 | Keller | F25J 1/0002 |
| | | | | 165/110 |
| 2018/0259130 | A1* | 9/2018 | Lin | F16K 99/0021 |
| 2022/0235988 | A1* | 7/2022 | Norlin | F25B 13/00 |

FOREIGN PATENT DOCUMENTS

| | | |
|---|---|---|
| CN | 205156657 U | 4/2016 |
| CN | 106017174 B | 5/2018 |
| CN | 209558961 U | 10/2019 |
| CN | 111355343 A | 6/2020 |
| CN | 111359354 A | 7/2020 |
| DE | 102018010103 A1 | 7/2019 |

OTHER PUBLICATIONS

Written Opinion and English Translation cited in PCT/CN2021/103674, dated Sep. 27, 2021, 6 pages.

* cited by examiner

US 11,519,669 B2

CONDENSER AND SEMICONDUCTOR PROCESSING MACHINE

CROSS-REFERENCE TO RELATED APPLICATION

The present disclosure is a national stage entry of International Application No. PCT/CN2021/103674, filed on Jun. 30, 2021, which claims priority for the Chinese patent application numbered 202011062187.X, titled "condenser and semiconductor processing machine", filed on Sep. 30, 2020. The entire contents of International Application No. PCT/CN2021/103674 and Chinese patent application numbered 202011062187.X are incorporated herein by reference.

TECHNICAL FIELD

The present disclosure relates to the technical field of semiconductors, and specifically a condenser and semiconductor processing machine.

BACKGROUND

The photoresist is one of the key materials for fine patterning processing in microelectronic technology, and in particular, the development of large-scale and ultra-large-scale integrated circuits in recent years has greatly promoted the research, development and application of photoresists.

In a semiconductor processing machine, the photoresist is baked at high temperature and then turned into photoresist vapor, which is discharged from an exhaust pipe. In order to prevent the photoresist from depositing in the exhaust pipe, the photoresist vapor is usually collected by condensing with a condenser before entering the exhaust pipe.

However, existing condensers have a poor condensation effect.

SUMMARY

According to an aspect of the present disclosure, a condenser is provided, comprising:
a sealed cavity; wherein,
a gas passage provided inside the sealed cavity, cooling liquid is filled around the gas passage;
a gas inlet, a gas outlet and a liquid outlet provided on the sealed cavity, the gas inlet is connected to the inlet of the gas passage, the gas outlet is connected to the outlet of the gas passage, and the liquid outlet is connected to the gas passage;
wherein, the gas passage is a Tesla valve structure passage.

According to an aspect of the present disclosure, a semiconductor processing machine is provided, comprising a photoresist vapor outlet, an exhaust gas outlet, a reservoir and a condenser as described in any one of the above items; wherein,
the photoresist vapor outlet is connected to the gas inlet of the condenser;
the exhaust gas outlet is connected to the gas outlet of the condenser;
the liquid outlet of the condenser is connected to the reservoir.

It should be understood that both the above general description and the following detailed description are exemplary and explanatory only, and are not restrictive of the present disclosure.

BRIEF DESCRIPTION OF THE DRAWINGS

The drawings here, which are incorporated into and form part of the specification, illustrate embodiments of the present disclosure, and serve to explain the principle of the present disclosure together with the specification. Obviously, the drawings described below are merely some embodiments of the present disclosure, and those ordinarily skilled in the art can derive other drawings from these drawings without making creative efforts.

DETAILED DESCRIPTION

Figure 1:
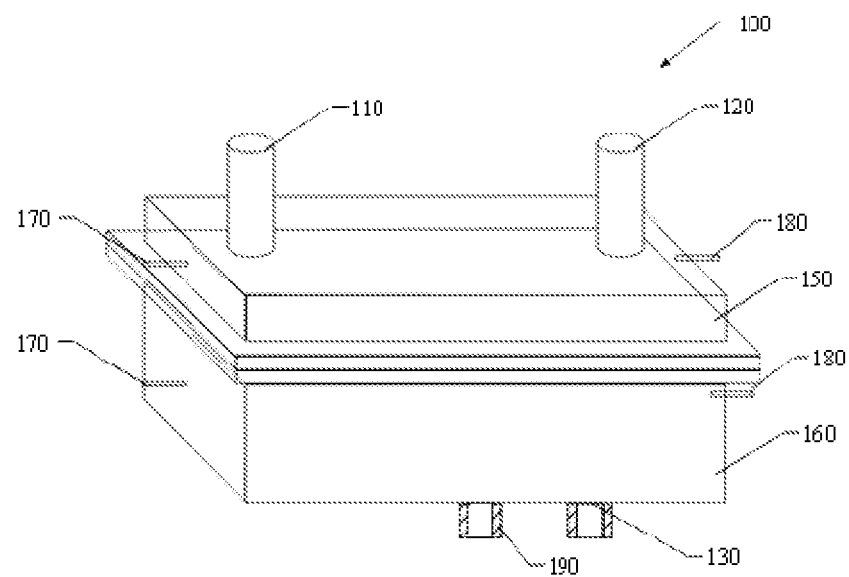
FIG. 1 schematically illustrates a structural diagram of a condenser according to an exemplary embodiment of the present disclosure.

Exemplary embodiments will now be described more fully with reference to the accompanying drawings. However, the exemplary embodiments could be implemented in many forms, and should not be construed as being limited to the embodiments set forth herein; on the contrary, these embodiments are provided in a way that makes the present disclosure more thorough and complete, and fully conveys the ideas of the exemplary embodiments to those skilled in the art. The same reference numbers in the drawings denote an identical or similar structure, and thus a detailed description thereof is omitted.

Although relative terms, such as "upper" and "lower," may be used herein to describe one component of an illustration relative to another, such terms are used herein for convenience only, e.g., with reference to the orientation of the example illustrated in a figure. It is understood that if the illustrated device is turned upside down, a component described as "upper" will become a "lower" one. Other relative terms, such as "high", "low", "top", "bottom", "left", "right", and the like, are also intended to have similar meanings. When a structure is "on" another structure, it may mean that this structure is integrally formed on such other structure, or "directly" disposed on such other structure, or "indirectly" disposed on such other structure via another structure.

The terms "a", "an", and "the" are used to indicate the presence of one or more elements/components, etc.; the terms "comprise" and "have" are intended to be inclusive and mean that there may be additional elements/components, etc. besides those listed.

In semiconductor processing, the photoresist is used to form a passivation layer, which has good thermal stability and good chemical resistance (oxidation resistance and moisture resistance); the photoresist is partially turned into vapor after being baked at high temperature and is exhausted by the facility, the vapor passes through the condenser at the tail end of the machine before reaching a facility exhaust pipeline, and the photoresist is condensed and attached to a trap by the cooling and condensation principle to prevent the photoresist from being deposited in the facility exhaust pipeline.

Photoresist condensers used by existing semiconductor processing machines table have a relatively poor condensation effect, so the photoresist may be condensed on the pressure control valve at the rear end. The condensed photoresist has strong adhesion, making it impossible to adjust the openness of the pressure control valve smoothly, thereby resulting in uncontrolled pressure and a halt to the process.

On this basis, an exemplary embodiment of the present disclosure provides a condenser, mainly used for gas condensation. The gas may be photoresist vapor or other mixed gas which needs to be separated, such as an oil-gas mixed gas. Any gas that needs to be condensed can be condensed using this condenser.

The condenser in the exemplary embodiment of the present disclosure is explained with specific embodiments as follows:

Referring to FIG. 1, a schematic structural diagram of a condenser according to an exemplary embodiment of the present disclosure is shown. As shown in FIG. 1, the condenser 100 provided by this exemplary embodiment comprises a sealed cavity, which is hermetically isolated from the outside and is hollow inside.

In an exemplary embodiment of the present disclosure, a gas passage is provided in the sealed cavity of the condenser 100, and cooling liquid is filled around the gas passage; a gas inlet 110, a gas outlet 120, and a liquid outlet 130 are provided on the sealed cavity, the gas inlet 110 is connected to the inlet of the gas passage, the gas outlet 120 is connected to the outlet of the gas passage, and the liquid outlet 130 is connected to the gas passage; wherein the gas passage is a Tesla valve structure passage.

In an exemplary embodiment of the present disclosure, by providing a gas passage in the sealed cavity, the gas to be condensed may enter from the gas inlet 110 connected to the gas passage; when the gas is flowing in the gas passage, since the cooling liquid is filled around the gas passage, the temperature of the cooling liquid can be transferred to the gas through the passage wall of the gas passage, so that the gas can be cooled; after the gas is cooled, a condensate is generated and discharged from the liquid outlet 130, and the gas not condensed is discharged from the gas outlet 120, thereby condensing the gas.

Figure 2:
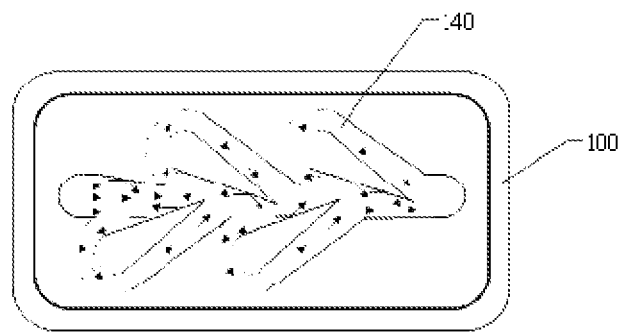
FIG. 2 schematically illustrates a first structural diagram of the gas passage of a condenser according to an exemplary embodiment of the present disclosure.
Figure 3:
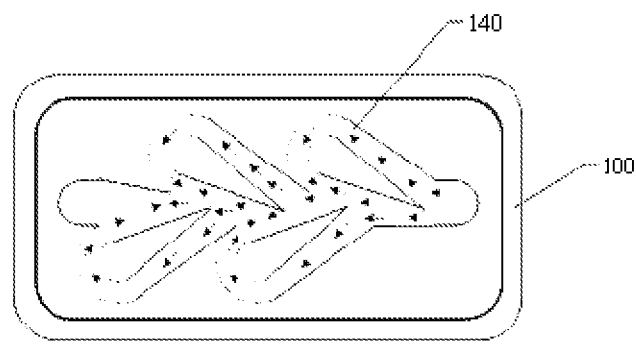
FIG. 3 schematically illustrates a second structural diagram of the gas passage of a condenser according to an exemplary embodiment of the present disclosure.

Referring to FIG. 2, a first schematic structural diagram of a gas passage of a condenser according to an exemplary embodiment of the present disclosure is shown. Referring to FIG. 3, a second schematic structural diagram of a gas passage of the condenser according to an exemplary embodiment of the present disclosure is shown. As shown in FIG. 2, in an exemplary embodiment of the present disclosure, the gas passage 140 is a Tesla valve structure passage. The Tesla valve is a one-way flow gas valve, which pushes gas to flow using a spatial structure. In this exemplary embodiment, a Tesla valve structure passage is provided. On one hand, when the gas flows in the Tesla valve structure passage, part of it passes through the central passage of the Tesla valve structure passage, a large part of it passes through the passages on both sides of the central passage, and the gas flow can be detoured, which increases the gas flow path, and thereby increases the contact area between the gas and passage walls of the gas passage, so that the gas has a sufficient chance to be cooled, and thus the condensation effect can be improved. On the other hand, the passage is a passive one-way passage with a fixed geometry due to the Tesla valve structure. As shown in FIG. 3, if the condensed exhaust gas flows backward, it can hardly return to the gas passage 140 along an opposite path, because the exhaust gas returning from the bend can block the returning exhaust gas, thereby preventing the return of the exhaust gas and reducing the reflux of the exhaust gas. On the other hand, the Tesla valve structure passage has no movable part, and the unidirectional flow of the gas flow can be realized without energy input, so that directional gas flow can be realized with a condenser of the Tesla valve structure passage without a power device, thereby saving the processing cost of the condenser and energy.

In practical applications, the sealed cavity may be a unitary structure or a structure composed of multiple components, which is not restricted in this exemplary embodiment. The sealed cavity may be a square cavity, a circular cavity, or a cavity in any other shape, which is not restricted in this exemplary embodiment. The size of the sealed cavity may be set according to actual requirements. For example, for a condenser used for a semiconductor processing machine, the size is okay as long as it matches the size of the semiconductor processing machine, which is not restricted in this exemplary embodiment.

Optionally, in an exemplary embodiment of the present disclosure, the sealed cavity is a square cavity that is 525 mm long, 325 mm high, and 250 mm wide.

Optionally, in an exemplary embodiment of the present disclosure, as shown in FIG. 1, the sealed cavity comprises a first cavity 150 and a second cavity 160 which are connected by sealing, wherein the sealed connection between the first cavity 150 and the second cavity 160 may be made through one or more of bonding, welding, and riveting, which is not restricted in this exemplary embodiment.

In the present exemplary embodiment, the first cavity 150 and the second cavity 160 are connected in a detachable pattern, specifically, connected through riveting, and a sealing ring is disposed at the contact position, so that a sealing effect can be realized.

The detachable connection of the first cavity 150 and the second cavity 160 in an exemplary embodiment of the present disclosure can facilitate subsequent detachment and cleaning, so that when a condensate such as a photoresist adheres to the inner wall of the gas passage 140, the condensate is cleaned in time, so as not to affect subsequent condensation.

In practical applications, the first cavity 150 and the second cavity 160 may be a left-right combined structure, an upper-lower combined structure, or any other combined structure, which is not restricted in this exemplary embodiment.

Optionally, in an exemplary embodiment of the present disclosure, as shown in FIG. 1, the first cavity 150 is an upper cavity, the second cavity 160 is a lower cavity, both the gas inlet 110 and the gas outlet 120 are provided on the first cavity 150, and the liquid outlet 130 is provided on the second cavity 160. By providing the gas inlet 110 and the gas outlet 120 on the upper cavity, the liquid outlet 130 is provided on the lower cavity, which is advantageous for gas-liquid separation. And the gas inlet 110 and the gas outlet 120 are provided on the upper cavity for easy connection and assembly with the semiconductor processing machine.

Figure 4:
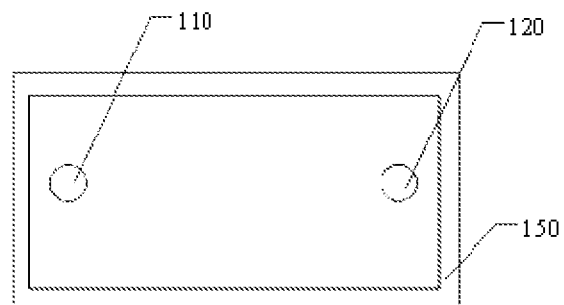
FIG. 4 schematically illustrates a top view of the first cavity of a condenser according to an exemplary embodiment of the present disclosure.
Figure 5:
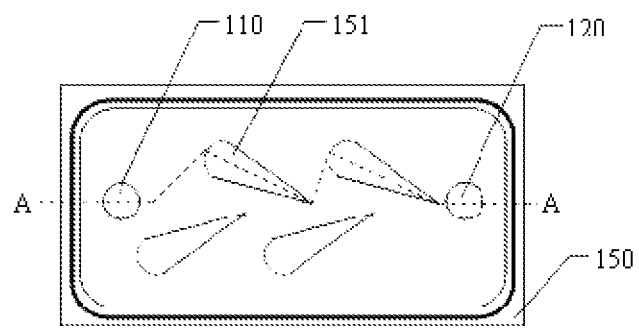
FIG. 5 schematically illustrates a bottom view of the first cavity of a condenser according to an exemplary embodiment of the present disclosure.
Figure 6:
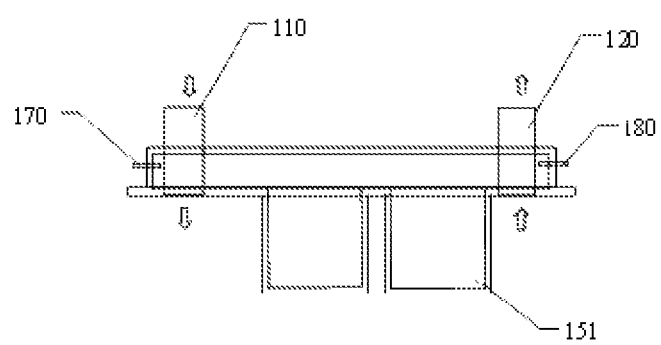
FIG. 6 schematically illustrates a schematic cross-section in Direction A-A in FIG. 5.

In this exemplary embodiment, a schematic structural diagram of the first cavity 150 is shown from different directions as in FIG. 4 to FIG. 6. As can be seen from the figures, a plurality of protrusions 151 are arranged at intervals inside the first cavity 150, and the protrusions 151 have the same structure and are arranged according to a certain rule.

Optionally, in this exemplary embodiment, each protrusion 151 comprises a first end and a second end, and the longitudinal cross-sectional area of the first end is smaller than the longitudinal cross-sectional area of the second end. Optionally, the cross-section of the protrusions 151 may be fan-shaped or in any other shape. The plurality of protrusions 151 are arranged in two rows, and the first ends of each row are disposed in the same direction.

In practical applications, the number and size of the protrusions 151 may be determined according to the size of the actual first cavity 150; for example, as shown in FIG. 4, there are 4 protrusions 151 of the same size. This exemplary embodiment imposes no particular restriction on the specific number and size of the protrusions 151.

Figure 7:
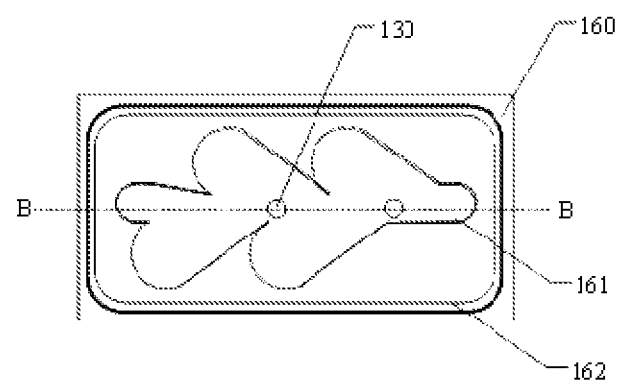
FIG. 7 schematically illustrates a top view of the second cavity of a condenser according to an exemplary embodiment of the present disclosure.
Figure 8:
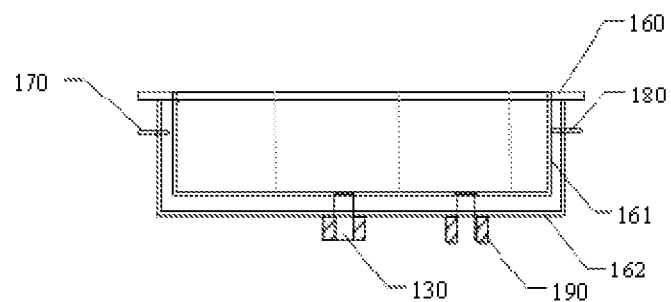
FIG. 8 schematically illustrates a schematic cross-section in Direction B-B in FIG. 7.

In this exemplary embodiment, a schematic structural diagram of the second cavity 160 is illustrated from different directions as in FIG. 7 and FIG. 8. As can be seen from the figures, a holding chamber 161 is provided in the second cavity 160, and a plurality of protrusions 151 are embedded into the holding chamber 161 to form a Tesla valve structure passage. Wherein, the shape of the holding chamber 161 matches the shape of the protrusions 151, and a gas passage 140 is formed between walls of the holding chamber 161 and sidewalls of the protrusions 151, as shown in FIG. 2.

In practical applications, in order to prevent the gas from flowing away elsewhere, the protrusions 151 may be hermetically connected to the bottom wall of the holding chamber 161 to ensure that the gas flow only circulates between walls of the holding chamber 161 and sidewalls of the protrusions 151.

In this exemplary embodiment, a Tesla valve structure passage may be formed by embedding a plurality of protrusions 151 into the holding chamber 161, and the gas flow path may be increased. In addition, the protrusions 151 on the first cavity 150 and the holding chamber 161 on the second cavity 160 smartly form a Tesla valve structure passage, so that the processing difficulty of the Tesla valve structure passage can be reduced, and the processing cost can be reduced by processing the protrusions 151 and the holding chamber 161 respectively.

In practical applications, the Tesla valve structure passage may have a variety of structural variations as long as both ends of the protrusions 151 are of different sizes, and the first end of the small end of the protrusions 151 faces the outlet of the Tesla valve structure passage.

Optionally, in this exemplary embodiment, the Tesla valve structure passage is a symmetrical structure, and a plurality of protrusions 151 are staggered at intervals on both sides of the centerline of the Tesla valve structure passage.

In an exemplary embodiment of the present disclosure, the second cavity 160 further comprises a housing 162, the holding chamber 161 is provided in the housing 162, and a gap is provided between walls of the holding chamber 161 and the housing 162, and filled with the cooling liquid.

On this basis, in this exemplary embodiment, the inside of the protrusions 151 may also be filled with the cooling liquid. That is to say, by filling the cooling liquid inside the protrusions 151, and between walls of the holding chamber 161 and the housing 162, the inner and outer sidewalls of the gas passage 140 can contact the cooling liquid, and the gas can be condensed by the cooling liquid everywhere when it flows, thereby increasing the effective contact area of the condenser 100, and further improving the condensation effect.

In practical applications, the thickness of the sidewall of the protrusions 151, and the thickness of the wall of the holding chamber 161 can be set according to the practical situation, such as 0.5~1.5 mm Provided the strength requirement is met, the sidewall of the protrusions 151 and the wall of the holding chamber 161 can be made thinner to facilitate the temperature transfer of the cooling liquid and improve the condensation effect.

In this exemplary embodiment, in order to fill the inside space of the protrusion 151 and the space between walls of the holding chamber 161 and the housing 162 with the cooling liquid, the cooling water inlet 170 and the cooling water outlet 180 are to be disposed on both the first cavity 150 and the second cavity 160. The cooling water inlet 170 and the cooling water outlet 180 of the first cavity 150 are respectively communicated with the inside of the protrusions 151; the cooling water inlet 170 and the cooling water outlet 180 of the second cavity 160 are respectively communicated with the gap between walls of the holding chamber 161 and the housing 162.

In practical applications, the cooling water inlet 170 and the cooling water outlet 180 may be disposed on both sides of the first cavity 150 and the second cavity 160, and the specific positions may be set according to actual needs, which is not restricted in this exemplary embodiment.

In practical applications, the flow rate of the cooling water can be set according to actual needs. For example, for a condenser for condensing the photoresist, the flow rate of the cooling water is set between 1 SLM and 5 SLM to obtain a good condensation effect; for other condensates, the flow rate can be set according to actual needs, and is not restricted in this exemplary embodiment.

In practical applications, the first cavity 150 and the second cavity 160 may be sized according to the practical situation. For example, for a square sealed cavity provided in the exemplary embodiment of the present disclosure, the height of the first cavity 150 may be 62.5 mm, and that of the second cavity 160 may be 262.5 mm. This exemplary embodiment does not impose any particular restriction on the sizes of the first cavity 150 and the second cavity 160.

In practical applications, in order to facilitate the discharge of the condensate from the liquid outlet 130, a drainpipe may be provided at the liquid outlet 130 for diversion.

In order to prevent any condensate such as the condensate of a photoresist vapor from adhering to the liquid outlet, in an exemplary embodiment of the present disclosure, a temperature adjustment module 190 is further provided on an outer wall of the drainpipe. The temperature adjustment module 190 can heat the drainpipe to prevent the condensate from adhering to the drainpipe, and dredge the drainpipe.

In practical applications, the temperature adjustment module 190 may have various structures; for example, the temperature adjustment module 190 comprises a control part and a heating part, wherein the heating part is wrapped on the outer wall of the drainpipe, and the control part is connected to the heating part and is used to control heating time and temperature of the heating part. The heating part may be a heating member such as a heating belt or a heating sheet, which is not restricted in this exemplary embodiment.

When the condenser 100 is used in a semiconductor processing machine, the control part may be configured to obtain an operating state of the semiconductor processing machine, and control the heating part to start heating when the operating state is suspension, so that the photoresist at the drainpipe is flowing, and will not adhere to the drainpipe and block the discharge of the condensate. When the operating state is running, the heating part is controlled to stop heating. The specific heating temperature may be determined according to the melting point of the condensate such as photoresist, which is not restricted in this exemplary embodiment.

In practical applications, the material of the sealed cavity may be a metal or a composite material, etc. For example, the sealed cavity may be made of corrosion-resistant stainless steel, which is not restricted in this exemplary embodiment.

According to the condenser in this exemplary embodiment, on one hand, when the gas flows in the Tesla valve structure passage, part of it passes through the central passage of the Tesla valve structure passage, and a large part of it passes through the passages on both sides of the central passage, and the gas flow can be detoured, which increases the gas flow path, and thereby increases the chance of the gas to contact passage walls of the gas passage, so that the gas has a sufficient chance to be cooled, and thus the condensation effect can be improved. On the other hand, the passage is a passive one-way passage with a fixed geometry due to the Tesla valve structure. If the condensed gas flows backward, it can hardly return to the gas passage along an opposite path, because the gas returning from the bend can block the returning gas, thereby preventing the return of the gas and reducing the reflux of the exhaust gas. On the other hand, the Tesla valve structure passage has no movable part, and the unidirectional flow of the gas flow can be realized without energy input, so that directional gas flow can be realized with a condenser of the Tesla valve structure passage without a power device, thereby saving the processing cost of the condenser and energy. Finally, by filling the cooling liquid inside the protrusions, and between walls of the holding chamber and the housing, the inner and outer sidewalls of the gas passage can contact the cooling liquid, and the gas can be condensed by the cooling liquid everywhere when it flows, thereby increasing the effective contact area of the condenser, and further improving the condensation effect.

An exemplary embodiment of the present disclosure further provides a semiconductor processing machine, comprising a photoresist vapor outlet, an exhaust gas outlet, a reservoir and a condenser 100 as described above; wherein the photoresist vapor outlet is communicated with the gas inlet 110 of the condenser 100; the exhaust gas outlet is communicated with the gas outlet 120 of the condenser 100; the liquid outlet 130 of the condenser 100 is communicated with the reservoir. The specific structural form and operating principle of the condenser 100 have been described in detail in the above embodiment, and are not repeated in this exemplary embodiment.

The photoresist vapor discharged from the photoresist vapor outlet enters the condenser 100 from the gas inlet 110, flows in the Tesla valve structure passage of the condenser 100 and is condensed, and the condensed photoresist is discharged into the reservoir from the liquid outlet 130; the condensed exhaust gas is discharged from the gas outlet 120 to the exhaust gas outlet and is discharged through the facility exhaust pipeline.

In summary, for the semiconductor processing machine in this exemplary embodiment, by providing the condenser, on one hand, the photoresist vapor can fully contact with walls of the gas passage when flowing in the Tesla valve structure passage, so that the photoresist vapor is fully cooled, and the condensation effect is improved. On the other hand, the passage is a passive one-way passage with a fixed geometry due to the Tesla valve structure. If the condensed exhaust gas flows backward, it can hardly return to the gas passage along an opposite path, because the exhaust gas returning from the bend can block the returning exhaust gas, thereby preventing the return of the exhaust gas and reducing the reflux of the exhaust gas. On the other hand, the Tesla valve structure passage has no movable part, and the unidirectional flow of the gas flow can be realized without energy input, so that directional gas flow can be realized with a condenser of the Tesla valve structure passage without a power device, thereby saving the processing cost of the condenser and energy.

Those skilled in the art can easily think of other embodiments of the present disclosure when considering the specification and practicing embodiments disclosed herein. The present application is intended to cover any variants, uses, or adaptations of the present disclosure following the general principles of the present disclosure and including common knowledge or customary technical means in the art not disclosed in the present disclosure. The specification and the embodiments are deemed exemplary only, and the true scope and spirit of the present disclosure are indicated by the claims.

It should be understood that the present disclosure is not limited to the precise structures that have been described above and shown in the drawings, and that various modifications and changes may be made without departing from the scope thereof. The scope of the present disclosure is defined by the appended claims only.

The invention claimed is:

1. A condenser, comprising:
  a sealed cavity;
  a gas passage provided inside the sealed cavity, cooling liquid is filled around the gas passage; and
  a gas inlet, a gas outlet and a liquid outlet provided on the sealed cavity,
  the gas inlet is connected to an inlet of the gas passage, the gas outlet is connected to an outlet of the gas passage, and the liquid outlet is connected to the gas passage;
  wherein:
  the gas passage is a Tesla valve structure passage,
  the sealed cavity comprises a first cavity and a second cavity hermetically connected,
  a plurality of protrusions are arranged at intervals in the first cavity,
  a holding chamber is provided in the second cavity, and the plurality of protrusions are embedded in the holding chamber to form the Tesla valve structure passage.

2. A condenser according to claim 1, wherein the plurality of protrusions are staggered on both sides of a centerline of the Tesla valve structure passage.

3. A condenser according to claim 1, wherein the protrusions comprise a first end and a second end;
  a longitudinal cross-sectional area of the first end is smaller than a longitudinal cross-sectional area of the second end;

the first end is disposed toward the outlet of the Tesla valve structure passage.

4. A condenser according to claim 1, wherein the protrusions are filled with the cooling liquid.

5. A condenser according to claim 1, wherein the second cavity further comprises a housing, the holding chamber is provided in the housing, and the cooling liquid is filled between walls of the holding chamber and the housing.

6. A condenser according to claim 1, wherein the first and second cavities are each provided with a cooling water inlet and a cooling water outlet.

7. A condenser according to claim 1, wherein
the first cavity is an upper cavity, and the second cavity is a lower cavity;
the gas inlet and the gas outlet are provided on the first cavity;
the liquid outlet is provided on the second cavity.

8. A condenser according to claim 1, wherein the protrusions are hermetically connected to a bottom wall of the holding chamber.

9. A semiconductor processing machine, comprising a photoresist vapor outlet, an exhaust gas outlet, a reservoir, and a condenser according to claim 1;
the photoresist vapor outlet is connected to an gas inlet of the condenser;
the exhaust gas outlet is connected to the gas outlet of the condenser;
the liquid outlet of the condenser is connected to the reservoir.

\* \* \* \* \*